United States Patent
Doyle et al.

(10) Patent No.: US 9,054,302 B2
(45) Date of Patent: Jun. 9, 2015

(54) PERPENDICULAR SPIN TRANSFER TORQUE MEMORY (STTM) DEVICE WITH ENHANCED STABILITY AND METHOD TO FORM SAME

(71) Applicants: Brian S. Doyle, Portland, OR (US); Charles C. Kuo, Hillsboro, OR (US); Kaan Oguz, Dublin (IE); Uday Shah, Portland, OR (US); Elijah V. Karpov, Santa Clara, CA (US); Roksana Golizadeh Mojarad, San Jose, CA (US); Mark L. Doczy, Portland, OR (US); Robert S. Chau, Portland, OR (US)

(72) Inventors: Brian S. Doyle, Portland, OR (US); Charles C. Kuo, Hillsboro, OR (US); Kaan Oguz, Dublin (IE); Uday Shah, Portland, OR (US); Elijah V. Karpov, Santa Clara, CA (US); Roksana Golizadeh Mojarad, San Jose, CA (US); Mark L. Doczy, Portland, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/313,690

(22) Filed: Jun. 24, 2014

(65) Prior Publication Data

US 2014/0308760 A1  Oct. 16, 2014

Related U.S. Application Data

(62) Division of application No. 13/723,893, filed on Dec. 21, 2012, now Pat. No. 8,796,797.

(51) Int. Cl.
*H01L 21/00* (2006.01)
*H01L 43/12* (2006.01)
*H01L 43/08* (2006.01)
*H01F 10/32* (2006.01)
*H01L 43/10* (2006.01)
*H01L 27/22* (2006.01)

(52) U.S. Cl.
CPC .............. *H01L 43/12* (2013.01); *H01L 43/08* (2013.01); *H01F 10/3286* (2013.01); *H01L 43/10* (2013.01); *H01L 27/228* (2013.01)

(58) Field of Classification Search
CPC ............................... H01L 43/10; H01L 43/12
USPC ............... 438/3, 48, 104; 257/421, E43.001; 365/158
See application file for complete search history.

(56) References Cited

U.S. PATENT DOCUMENTS

| | | |
|---|---|---|
| 2007/0253122 A1 | 11/2007 | Fukuzawa et al. |
| 2010/0096716 A1 | 4/2010 | Ranjan et al. |
| 2010/0109110 A1 | 5/2010 | Wang et al. |
| 2012/0038011 A1* | 2/2012 | Iba .................. 257/421 |
| 2012/0063218 A1 | 3/2012 | Huai et al. |
| 2012/0146167 A1 | 6/2012 | Huai et al. |
| 2013/0033931 A1 | 2/2013 | Yamane et al. |
| 2013/0075839 A1 | 3/2013 | Chen et al. |

OTHER PUBLICATIONS

International Search Report and Written Opinion for PCT Patent Application No. PCT/US2013/045498 mailed Sep. 17, 2013, 12 pgs.
Non-Final Office Action from U.S. Appl. No. 13/723,893 mailed Dec. 4, 2013, 9 pgs.

* cited by examiner

*Primary Examiner* — Tu-Tu Ho
(74) *Attorney, Agent, or Firm* — Blakely, Sokoloff, Taylor & Zafman LLP

(57) ABSTRACT

Perpendicular spin transfer torque memory (STTM) devices with enhanced stability and methods of fabricating perpendicular STTM devices with enhanced stability are described. For example, a material layer stack for a magnetic tunneling junction includes a fixed magnetic layer. A dielectric layer is disposed above the fixed magnetic layer. A free magnetic layer is disposed above the dielectric layer. A conductive oxide material layer is disposed on the free magnetic layer.

5 Claims, 4 Drawing Sheets

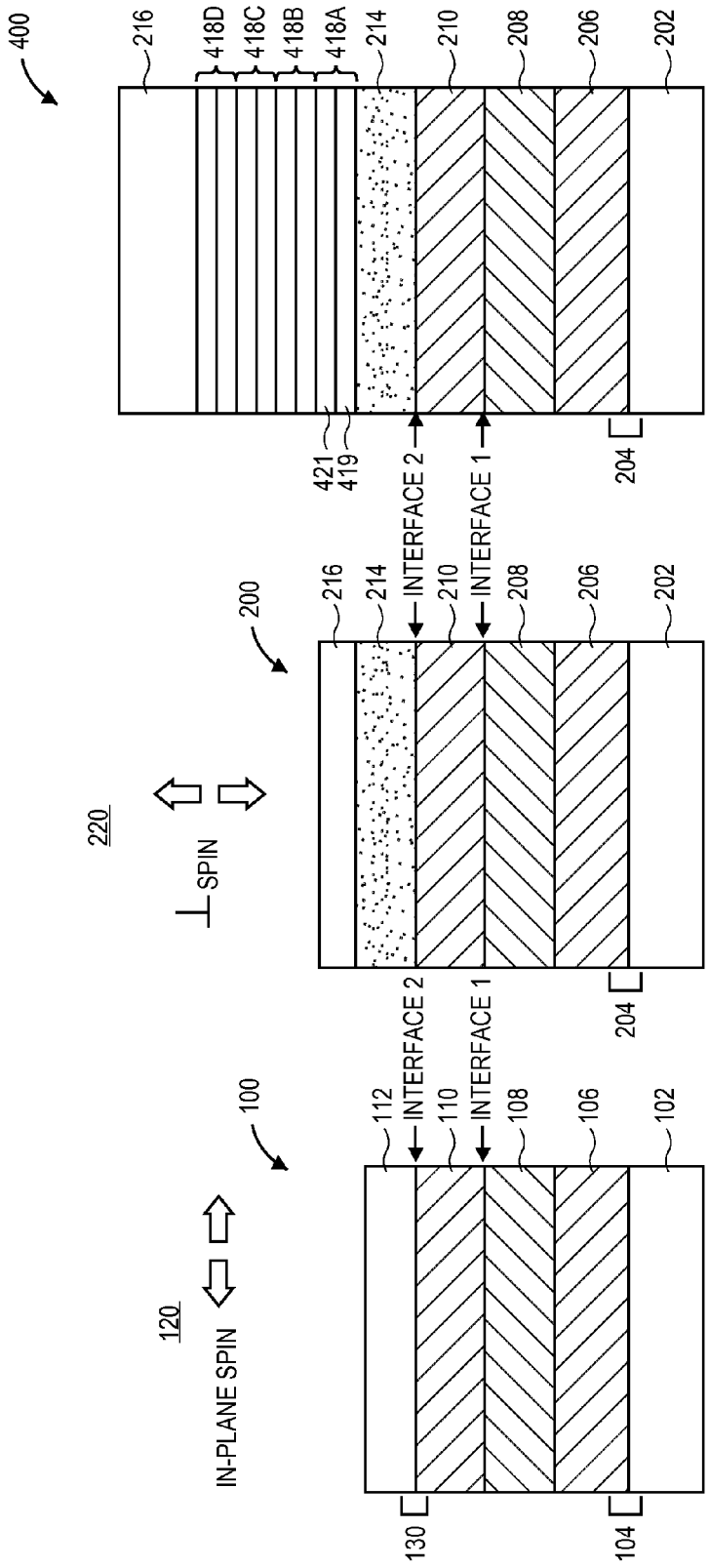

PERPENDICULAR SPIN TRANSFER TORQUE MEMORY (STTM) DEVICE WITH ENHANCED STABILITY AND METHOD TO FORM SAME

CROSS-REFERENCE TO RELATED APPLICATIONS

This application is a divisional of U.S. patent application Ser. No. 13/723,893, filed on Dec. 21, 2012, the entire contents of which are hereby incorporated by reference herein.

TECHNICAL FIELD

Embodiments of the invention are in the field of memory devices and, in particular, perpendicular spin transfer torque memory (STTM) devices with enhanced stability and methods of fabricating perpendicular STTM devices with enhanced stability.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will come out spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements. However, significant improvements are still needed in the area of STTM device manufacture and usage.

BRIEF DESCRIPTION OF THE DRAWINGS

FIG. 1 illustrates a cross-sectional view of a material layer stack for a conventional spin transfer torque memory (STTM) device.

FIG. 2 illustrates a cross-sectional view of a material layer stack for a perpendicular STTM device, in accordance with an embodiment of the present invention.

FIG. 4 illustrates a cross-sectional view of another material layer stack for a perpendicular STTM device, in accordance with another embodiment of the present invention.

DESCRIPTION OF THE EMBODIMENTS

Figure 3:
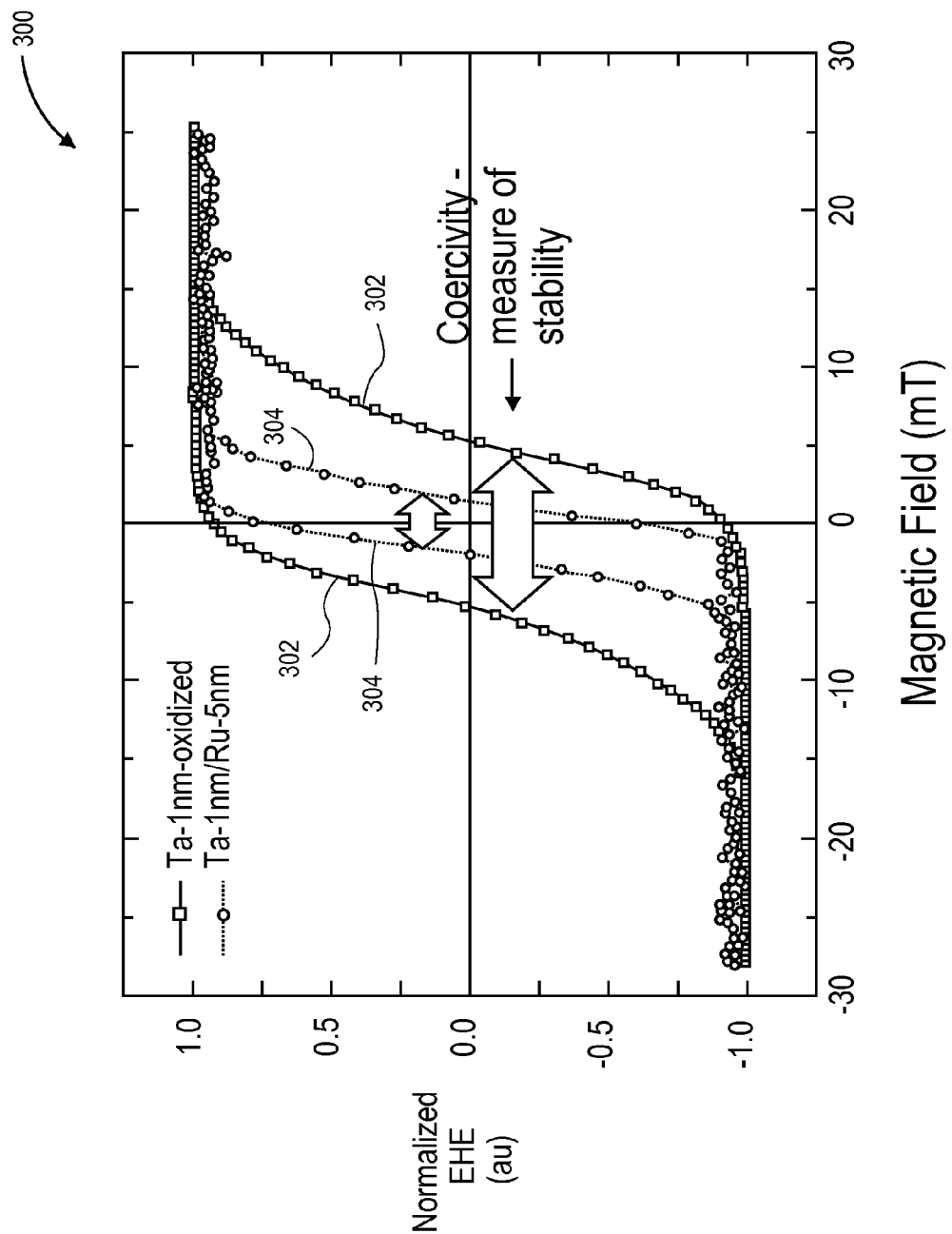
FIG. 3 is a plot of normalized extraordinary Hall effect (EHE) (in arbitrary units) as a function of magnetic field (mT) for comparative STTM devices, in accordance with an embodiment of the present invention.

Perpendicular spin transfer torque memory (STTM) devices with enhanced stability and methods of fabricating perpendicular STTM devices with enhanced stability are described. In the following description, numerous specific details are set forth, such as specific magnetic layer integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments are directed to methodologies for increasing stability in perpendicular STTM systems. Applicants may include use in embedded memory, embedded non-volatile memory (NVM), magnetic random access memory (MRAM), magnetic tunnel junction (MTJ) devices, NVM, perpendicular MTJ, STTM, and non-embedded or stand-alone memories. In an embodiment, stability in perpendicular STTM devices is achieved by incorporating a conductive oxide layer adjacent a free magnetic layer, as is described in greater detail below. The conductive oxide layer may have a dual role to act as a portion of an electrode and to oxidize a portion of iron/cobalt (Fe/Co) included in the composition of the free magnetic layer.

Stability is one of the most important issues facing scaling of STTM based devices and memory arrays fabricated there from. As scaling continues, the need for smaller memory elements to fit into a scaled cell size has driven the industry in the direction of perpendicular STTMs, which have higher stability for small memory element sizes. Common perpendicular STTMs are achieved by three approaches, all of which rely on interface tuning to derive a maximum amount of perpendicular strength and, hence, stability from a material stack that includes magnetic layers.

As a foundation for illustrating key concepts described herein, FIG. 1 illustrates a cross-sectional view of a material layer stack for a conventional spin transfer torque memory (STTM) device. Referring to FIG. 1, a material layer stack 100 for an in-plane STTM device includes a bottom electrode 102, a fixed magnetic layer 106, a dielectric layer 108, a free magnetic layer 110, and a top electrode 112. A magnetic tunnel junction (MTJ) portion of the material layer stack 100 includes the fixed magnetic layer 106, the dielectric layer 108, and the free magnetic layer 110. Material stack 100 is a basic material stack for fabricating STTM, and may be fabricated with greater complexity. For example, although not shown in the stack 100, an anti-ferromagnetic layer may also be included in position 104, i.e., between bottom electrode 102 and fixed magnetic layer 106. Additionally, electrodes 102 and 112 may themselves include multiple layers of material with differing properties. The material stack shown in FIG. 1 may, in its most basic form, be an in-plane system, where spins of the magnetic layer 106 and 110 are in a same plane as the layers themselves, as illustrated by 120 in FIG. 1.

Without further engineering, the material stack 100 of FIG. 1 is typically an in-plane spin system. However, with layer or interface engineering, the material stack may be fabricated to provide a perpendicular spin system. In a first example, referring again to the features of material stack 100 as a platform, a free magnetic layer 110, e.g., a free magnetic layer composed of CoFeB, is thinned down from a conventional thickness used for in-plane STTM devices. The extent of thinning may be sufficient such that a perpendicular component obtained from the iron/cobalt (Fe/Co) in the layer 110 interacting with oxygen in the dielectric layer 108 (e.g., interacting with a magnesium oxide (MgO) layer 108 at interface 1 of FIG. 1) dominates over the in-plane component of the free CoFeB layer 110. This example provides a perpendicular system based on a single layer system of coupling to one interface of the free layer (i.e., the CoFeB—MgO interface). The degree of oxidation of surface iron/cobalt atoms (Fe/Co) in the CoFeB layer by oxygen from the MgO layer provides the strength (stability) of the free layer to have perpendicular-dominated spin states. In this example, electrodes 102 and 112 are composed of a single metal such as tantalum (Ta).

In a second example, referring again to the features of material stack 100 as a platform, top electrode 112 is replaced with a multi-layer stack electrode of alternating magnetic (e.g., cobalt (Co)) and non-magnetic layers (e.g., palladium (Pd)). Such a multi-layer scheme provides that each magnetic thin film layer (Co) has an interface which is perpendicular in spin direction. The final (bottom) Co layer in this stack, e.g., the Co layer that is on free layer 110 and forms interface 2, couples magnetically to the underlying CoFeB free layer 110. Alternatively, a thin layer of tantalum (Ta) can be included between the final (bottom) Co layer in the stack and the free layer 110. The sum of all the interfaces (starting with interface 2) in the electrode 112 having alternating magnetic and non-magnetic layers in the full free layer and, possibly, in addition to interface 1, renders stability for the material of the free layer 110 to be perpendicular. That is, for this second example, stability drivers for a perpendicular spin device include a combination of the MgO coupling of the first example (i.e., from interface 1) as previously described, plus additional coupling interface 2 of the free layer 110 to an upper perpendicular magnet.

In a third example, referring again to the features of material stack 100 as a platform, a structure similar to the first example is provided. However, an additional tunneling barrier filter layer (e.g., a second MgO layer) is added to the stack at position 130, shown in FIG. 1. The inclusion of a second MgO layer allows oxygen from such a top MgO layer to interact with (e.g., oxidize) the Fe/Co in at the top of the CoFeB free layer 110, practically doubling the stability of the cell over the first example. However, as attractive as this approach is, there is a fundamental problem with the addition of a second MgO layer in the stack 100. Namely, such a second MgO layer is in reality a thin dielectric film which can increase the resistance of the resulting stack considerably. The resistance may increase to the point that it interferes with the ability to detect the difference between a '1' state and a '0' state, the detecting described in greater detail below.

In another aspect, stability of a perpendicular nature or dominance of an STTM cell is enhanced by the use of a conductive oxide layer within the stack. As an example, FIG. 2 illustrates a cross-sectional view of a material layer stack for a perpendicular STTM device, in accordance with an embodiment of the present invention.

Referring to FIG. 2, a material layer stack 200 for a perpendicular STTM device includes a bottom electrode 202, a fixed magnetic layer 206, a dielectric layer 208, a free magnetic layer 210, and a top electrode. The top electrode is composed of a conductive oxide layer 214 and, possibly, an additional metal cap layer 216. A magnetic tunnel junction (MTJ) portion of the material layer stack 200 includes the fixed magnetic layer 206, the dielectric layer 208, and the free magnetic layer 210. Material stack 200 is a basic material stack for fabricating perpendicular STTM, and may be fabricated with greater complexity. For example, although not shown in the stack 200, an anti-ferromagnetic layer may also be included in position 204, i.e., between bottom electrode 202 and fixed magnetic layer 206. Additionally, electrode 202 may itself include multiple layers of material with differing properties. In an embodiment, the material stack shown in FIG. 2 is a perpendicular system, where spins of the magnetic layer 206 and 210 are perpendicular to the plane of the layers themselves, as illustrated by 220 in FIG. 2.

Referring again to FIG. 2, a perpendicular component obtained from the iron/cobalt (Fe/Co) in the layer 210 (e.g., a layer of CoFeB) interacting with oxygen in the dielectric layer 208 (e.g., interacting with a magnesium oxide (MgO) layer 208 at interface 1 of FIG. 2) dominates over an in-plane component of the free CoFeB layer 210. Additionally, a second perpendicular component is obtained from the iron/cobalt (Fe/Co) in the CoFeB layer 210 interacting with oxygen in the conductive oxide layer 214 (e.g., interacting with oxygen at interface 2 of FIG. 2). However, different from the above described third example where a second MgO layer was used to oxidize a top surface of a CoFeB free layer, the conductive oxide layer 214 does not contribute measurably or significantly to the overall resistance of the stack 200. As such, perpendicular dominance is further enhanced by, in addition to the oxidation of Fe/Co at interface 1, oxidizing Fe/Co at interface 2. The oxidizing is achieved without adding resistance and, thus, the conductive oxide layer 214 responsible for the oxidizing at interface 2 is the first layer in an electrode for the free magnetic layer 210. As mentioned above, an additional metal layer 216 (e.g., a non-magnetic and oxygen-free metal layer) may be included on the conductive oxide layer 214 to complete the electrode for the free layer 210. Thus, in an embodiment, two perpendicular components are used to dominate over an in-plane component of the free CoFeB layer 210, e.g., at interfaces 1 and 2.

As a comparison between the extent of perpendicular stability in a conventional STTM stack (such as stack 100) and a STTM stack including a conductive oxide layer (such as stack 200), FIG. 3 is a plot 300 of normalized EHE (in arbitrary units) as a function of magnetic field (mT) for comparative STTM devices, in accordance with an embodiment of the present invention.

Referring to plot 300, a first plot 302 is for an STTM device having an oxidized tantalum layer (e.g., a conductive oxide layer) adjacent a free magnetic layer. A second plot 304 is for an STTM device having an oxygen-free tantalum (Ta) layer adjacent a free magnetic layer and capped with a ruthenium (Ru) layer to ensure oxidation of the Ta does not occur. The indicated coercivity (width of the corresponding hysteresis loop) is a measurement of stability of the perpendicular spin states (i.e., of the perpendicular magnet) of the free magnetic layer. As shown in plot 300, the coercivity is increased by approximately 3-4 fold for the device including the conductive oxide layer (plot 302) as compared to the more conventional material stack (plot 304). Additionally, it is to be understood that the stack of plot 302 has no to minimal additional resistance since the oxidation of the tantalum results in a conductive oxide layer as opposed to a dielectric layer. This may further be kept to a minimum by maintaining a relatively thin thickness for the conductive oxide layer, e.g., a thickness of approximately 1 nanometer oxidized tantalum was used for the conductive oxide layer of plot 302. For the data specific to plot 300, an underlying MgO layer was used for both cases with a thickness of approximately 2 nanometers, and a free layer of $Co_{20}Fe_{60}B_{20}$ having a thickness of approximately 1.4 nanometers was used for both cases.

In a second example of a material stack including a conductive oxide layer, FIG. 4 illustrates a cross-sectional view of another material layer stack for a perpendicular STTM device, in accordance with another embodiment of the present invention.

Referring to FIG. 4, a material stack 400 includes the layers of material stack 200 described above in association with FIG. 2, along with pairs of alternating magnetic 419 and non-magnetic 421 metal layers between the conductive oxide layer 214 and the cap electrode layer 216. For example, in one embodiment, the magnetic metal layers 419 are cobalt (Co) layers and the non-magnetic layers 421 are palladium (Pd) layers. In a specific embodiment, four pairs 418A, 418B, 418C and 418D of alternating layers 419 and 421 are included, although fewer or more pairs may be included. Such a multi-layer top electrode approach provides that each magnetic thin film layer (Co, layer 419) has an interface which is perpendicular in spin direction. The final (bottom) Co layer in this stack, e.g., the Co layer 419 that is on conductive oxide layer 214, couples magnetically to the underlying CoFeB free layer 210. The sum of all the interfaces in the pairs 418A, 418B, 418C and 418D having alternating magnetic 419 and non-magnetic layers 421 can be used to render stability for the material of the free layer 210 to be perpendicular. In one such embodiment, for sufficiently thin layers of the conductive oxide layer 214, the magnetic coupling between the bottom Co layer 419 and the free layer 210 is maintained. Thus, the material stack 400 includes three perpendicular components: the oxidized bottom layer of the CoFeB layer 210 (at interface 1), the oxidized top layer of the CoFeB layer 210 (at interface 2) resulting from the conductive oxide layer 214, and the coupling between the Co/Pd perpendicular stack and the CoFeB free layer 210 through a sufficiently thin conductive oxide layer 214. A cap layer, such as a pure Ru layer or Ta layer may be included as layer 216, as depicted in FIG. 4.

Referring again to FIGS. 2 and 4, in an embodiment, the conductive oxide layer 214 is an oxide of tantalum, as was the example of FIG. 3. In another embodiment, however, the conductive oxide layer 214 is composed of a material such as, but not limited to, $In_2O_{3-x}$ (tunable resistivity approximately in the range of 1-10 mOhm·cm), $VO_2$ or $V_2O_3$ (resistivity less than approximately 1 mOhm·cm), $WO_2$ (resistivity less than approximately 1 mOhm·cm), Sn-doped $In_2O_3$ (ITO) and doped ZnO, with In or Ga, for example, (resistivity less than approximately 0.1 mOhm·cm), or RuO resistivity less than approximately 0.1 mOhm·cm). In an embodiment, the conductive oxide layer 214 (whether a metal that is then oxidized or a conducting metal oxide) is 100-1000× more conductive than MgO which has a resistivity of approximately 1 Ohm·cm. In an embodiment, the conductive oxide layer 214 is formed by depositing a metal film and then consuming the metal film with oxygen, depositing a metal film in the presence of oxygen to consume the metal in situ, or by depositing a conductive oxide film in a stoichiometric manner. In an embodiment, a cap metal layer 216 may be disposed on the conductive oxide layer 214, as described above. In one such embodiment, the metal layer 216 is composed of ruthenium (Ru), copper, or aluminum.

Referring again to FIGS. 2 and 4, in an embodiment, the fixed magnetic layer 206 is composed of a material or stack of materials suitable for maintaining a fixed majority spin. Thus, the fixed magnetic layer 206 (or reference layer) may be referred to as a ferromagnetic layer. In one embodiment, the fixed magnetic layer 206 is composed of a single layer of cobalt iron boron (CoFeB). However, in another embodiment, the fixed magnetic layer 206 is composed of a cobalt iron boron (CoFeB) layer, ruthenium/(Ru) layer, cobalt iron boron (CoFeB) layer stack. In a specific such embodiment, the fixed magnetic layer is in the form of a synthetic antiferromagnet (SAF). From a top down perspective, the stack is a CoFeB/Ru/CoFe stack (e.g., no boron in the bottom layer, but there may be in other embodiments). It is to be understood that Ru thickness is very specific, e.g., 8-9 Angstroms such that the coupling between the CoFeB and the CoFe is anti-ferromagnetic; they point in opposite directions.

Referring again to FIGS. 2 and 4, in an embodiment, the dielectric layer 208 is composed of a material suitable for allowing current of a majority spin to pass through the layer, while impeding at least to some extent current of a minority spin to pass through the layer. Thus, the dielectric layer 208 (or spin filter layer) may be referred to as a tunneling layer. In one embodiment, the dielectric layer 208 is composed of a material such as, but not limited to, magnesium oxide (MgO) or aluminum oxide ($Al_2O_3$). In one embodiment, the dielectric layer 208 has a thickness of approximately 1 nanometer.

Referring again to FIGS. 2 and 4, in an embodiment, the free magnetic layer 210 is composed of a material suitable for transitioning between a majority spin and a minority spin, depending on the application. Thus, the free magnetic layer 210 (or memory layer) may be referred to as a ferromagnetic memory layer. In one embodiment, the free magnetic layer 210 is composed of a layer of cobalt iron (CoFe) or cobalt iron boron (CoFeB).

Referring again to FIGS. 2 and 4, in an embodiment, the bottom electrode 202 is composed of a material or stack of materials suitable for electrically contacting the fixed magnetic layer side of a STTM device. In an embodiment, the bottom electrode 202 is a topographically smooth electrode. In one such embodiment, the bottom electrode 202 has a thickness suitable for good conductivity but has little to no columnar structure formation that would otherwise lead to a rough top surface. Such a topographically smooth electrode may be referred to as amorphous in structure. In a specific embodiment, the bottom electrode is composed of Ru layers interleaved with Ta layers. Effectively, in accordance with an embodiment of the present invention, the bottom electrode 202 may not be not a conventional thick single metal electrode, such as a Ru electrode, but is instead a Ru/Ta interleaved materials stack. In alternative embodiments, however, the bottom electrode 202 is a conventional thick single metal electrode, such as a Ru electrode.

Figure 5:
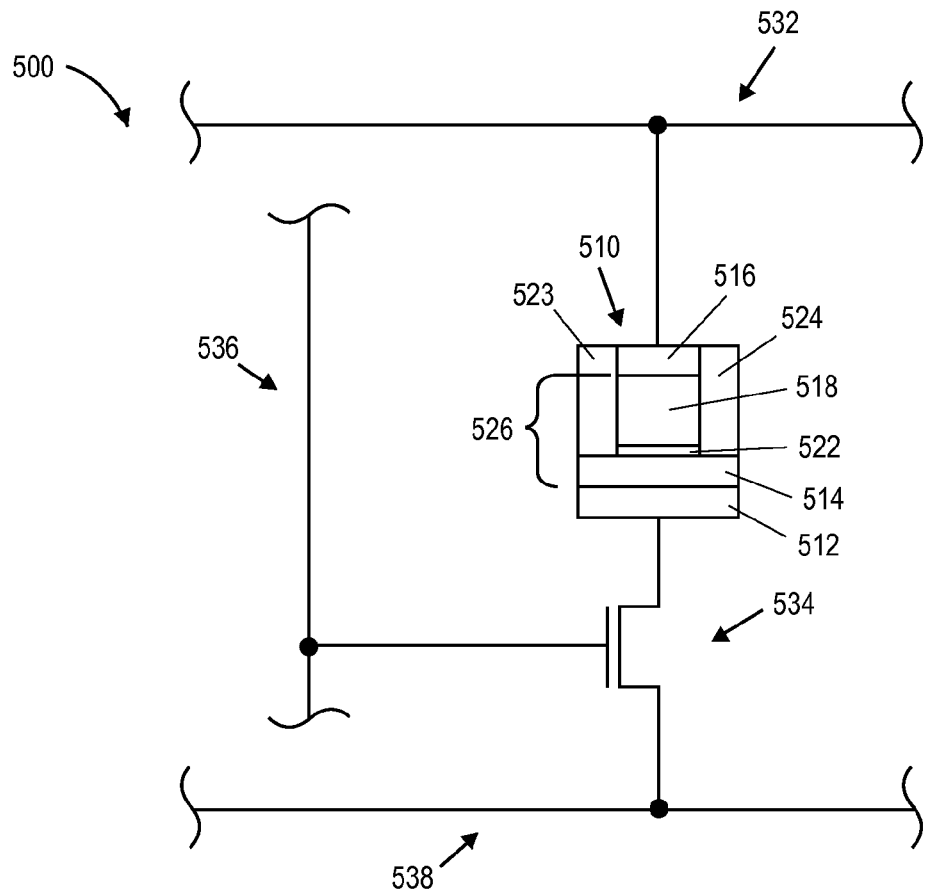
FIG. 5 illustrates a schematic of a spin transfer torque memory bit cell which includes a spin transfer torque element, in accordance with an embodiment of the present invention.

Referring again to FIGS. 2 and 4, in an embodiment, the ferromagnetic layer 204 is composed of a material suitable to facilitate locking of the spins in an adjacent fixed magnetic layer, such as fixed magnetic layer 206, which itself might be composed either of a material stack such as, but not limited to, a series of Co/Pd multilayers similar to 418 in one embodiment, or of a Synthetic AntiFerromagnetic system (SAF) in another embodiment which is composed, of a stack such as multi-layers 418 separated by a spacer followed by another multi-layer stack 418, where the number of multi-layers is varied, and the spacer is of Ta or some other material whose thickness is chosen to induce anti-ferromagnetic coupling In an embodiment, as described in additional detail later in association with FIG. 5, a non-volatile memory device includes a first electrode and a fixed magnetic layer disposed above the first electrode. A free magnetic layer is disposed above the fixed magnetic layer, and a second electrode is disposed above the free magnetic layer. A dielectric layer is disposed between the free magnetic layer and the fixed magnetic layer. The second electrode includes a conductive oxide layer adjacent the free magnetic layer. The non-volatile memory device also includes a transistor electrically connected to the free magnetic layer electrode, a source line, and a word line. In one embodiment, the non-volatile memory device further includes an anti-ferromagnetic layer disposed between the fixed magnetic layer and the first electrode.

In certain aspects and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer 208 is to cause a large magneto-resistance ratio. The magneto-resistance is the ratio of the difference between resistances when the two ferromagnetic layers have anti-parallel magnetizations and the resistance of the state with the parallel magnetizations.

Referring again to FIGS. 2 and 4, the portion of the spin transfer torque element 200 or 400 including the free magnetic layer 210, the tunneling barrier layer 208, and the fixed magnetic layer 206 is known as a magnetic tunneling junction. The free magnetic layer 210 and the fixed magnetic layer 206 may be ferromagnetic layers). The tunneling barrier layer 208, which separates the free magnetic layer 210 and the fixed magnetic layer 206, may have a thickness, e.g. a distance between the free magnetic layer 210 and the fixed magnetic layer 206 of about 1 nanometer or less, such that electrons can tunnel there through, if a bias voltage is applied between the free magnetic layer electrode 214/216 and the fixed magnetic layer electrode 202.

In an embodiment, the MTJ functions essentially as a resistor, where the resistance of an electrical path through the MTJ may exist in two resistive states, either "high" or "low," depending on the direction or orientation of magnetization in the free magnetic layer 210 and in the fixed magnetic layer 206. Referring to FIGS. 2 and 4, in the case that the spin direction is to the down (minority) in the free magnetic layer 210, a high resistive state exists, wherein direction of magnetization in the free magnetic layer 210 and the fixed magnetic layer 206 are substantially opposed or anti-parallel with one another. Referring again to FIGS. 2 and 4, in the case that the spin direction is up (majority) in the free magnetic layer 210, a low resistive state exists, wherein the direction of magnetization in the free magnetic layer 210 and the fixed magnetic layer 206 is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 210 may be switched through a process call spin transfer torque ("STT") using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layer 206. The electrons of the spin polarized current from the fixed magnetic layer 206 tunnel through the tunneling barrier or dielectric layer 208 and transfers its spin angular momentum to the free magnetic layer 210, wherein the free magnetic layer 210 will orient its magnetic direction from anti-parallel to that of the fixed magnetic layer 206 or parallel. The free magnetic layer 210 may be returned to its original orientation by reversing the current.

Thus, the MTJ may store a single bit of information ("0" or "1") by its state of magnetization. The information stored in the MTJ is sensed by driving a current through the MTJ. The free magnetic layer 210 does not require power to retain its magnetic orientations. As such, the state of the MTJ is preserved when power to the device is removed. Therefore, a spin transfer torque memory bit cell composed of the stack 200 or 400 of FIG. 2 or 4, respectively, is, in an embodiment, non-volatile.

Although the method of fabricating the stack of layers 200 or 400 for, e.g., a spin transfer torque memory bit cell has not been described complete detail herein, it is understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

In accordance with another embodiment of the present invention, one of the fixed magnetic layer 206, the free magnetic layer 210, or both, includes a half-metal material layer. In a first example, in one embodiment, a half-metal material layer is included at the fixed magnetic layer 206 and dielectric layer 208 interface. In a specific such embodiment, the fixed magnetic layer 206 is a single layer composed of the half-metal material. However, in another specific embodiment, only a portion of the fixed magnetic layer 206 is composed of the half-metal material. In a second example, in another embodiment, a half-metal material layer is included at the free magnetic layer 210 and dielectric layer 208 interface. In a specific such embodiment, the free magnetic layer 210 is a single layer composed of the half-metal material. However, in another specific embodiment, only a portion of the free magnetic layer 210 is composed of the half-metal material, e.g., as a sub-layer at the interface with the dielectric layer 208. In a third example, in yet another embodiment, a first half-metal material layer is included at the fixed magnetic layer 206 and dielectric layer 208 interface and a second half-metal material layer is included at the free magnetic layer 210 and dielectric layer 208 interface. In an embodiment, half-metals (e.g. Heusler alloys) are included to increase the difference between anti-parallel resistance (RAP) and parallel resistance (RP) (i.e. AR) in magnetic tunneling junction (MTJ) devices.

In an embodiment, the half-metal material layers described above are referred to as a Heusler alloy, which is a ferromagnetic metal alloy based on a Heusler phase. Heusler phases may be intermetallics with particular composition and face-centered cubic crystal structure. The materials are ferromagnetic, even though the constituting elements are not, as a result of the double-exchange mechanism between neighboring magnetic ions. The materials usually include manganese ions, which sit at the body centers of the cubic structure and carry most of the magnetic moment of the alloy. In a specific embodiment, the half-metal material layer included in either the fixed magnetic layer 206, the free magnetic layer 210, or both, are material layers such as, but not limited to, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2Val$, $Mn_2VGa$, or $Co_2FeGe$.

Referring again to the description associated with FIGS. 2 and 4, a stack of layers including magnetic material layers and a conductive oxide layer, e.g., which are used in a magnetic tunneling junction, may be used to fabricate as memory bit cell. For example, FIG. 5 illustrates a schematic of a spin transfer torque memory bit cell 500 which includes a spin transfer torque element 510, in accordance with an embodiment of the present invention.

Referring to FIG. 5, the spin transfer torque element 510 may include a free magnetic layer electrode 512 with a free magnetic layer 514 adjacent the free magnetic layer electrode 512, a fixed magnetic layer electrode 516 adjacent a fixed magnetic layer 518, and a tunneling barrier or dielectric layer 522 disposed between the free magnetic layer 514 and the fixed magnetic layer 518. In an embodiment, the free magnetic layer electrode 512 includes a conductive oxide layer adjacent the free magnetic layer 514. In an embodiment, the spin transfer torque element 510 is based on perpendicular magnetism.

A first dielectric element 523 and a second dielectric element 524 may be formed adjacent the fixed magnetic layer electrode 516, the fixed magnetic layer 518, and the tunneling barrier or dielectric layer 522. The fixed magnetic layer electrode 516 may be electrically connected to a bit line 532. The free magnetic layer electrode 512 may be coupled with a transistor 534. The transistor 534 may be coupled with a word line 536 and a source line 538 in a manner that will be understood to those skilled in the art. The spin transfer torque memory bit cell 500 may further include additional read and write circuitry (not shown), a sense amplifier (not shown), a bit line reference (not shown), and the like, as will be understood by those skilled in the art, for the operation of the spin transfer torque memory bit cell 500. It is to be understood that a plurality of the spin transfer torque memory bit cells 500 may be operably connected to one another to form a memory array (not shown), wherein the memory array can be incorporated into a non-volatile memory device. It is to be understood that the transistor 534 may be connected to the fixed magnetic layer electrode 516 or the free magnetic layer electrode 512, although only the latter is shown.

Figure 6:
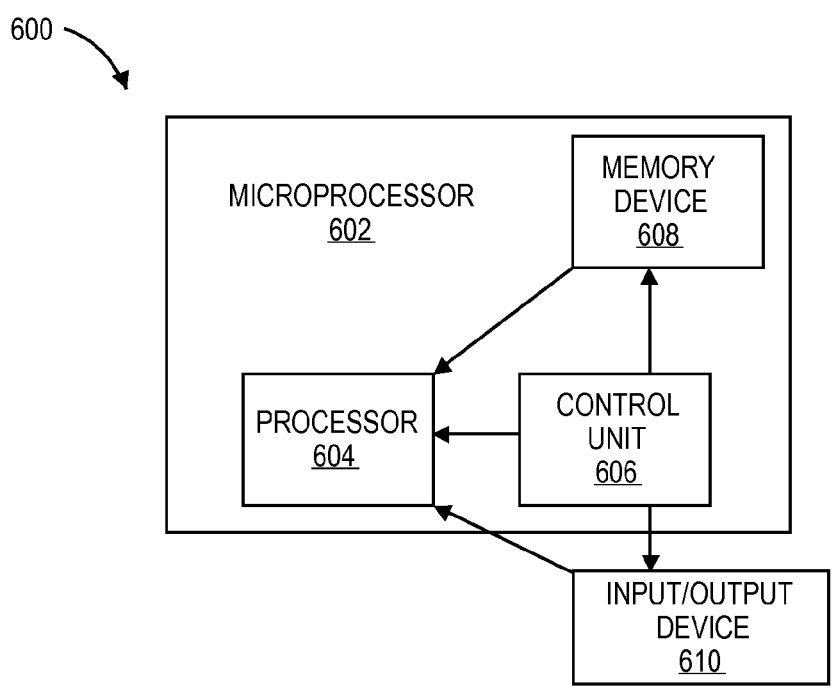
FIG. 6 illustrates a block diagram of an electronic system, in accordance with an embodiment of the present invention.

FIG. 6 illustrates a block diagram of an electronic system 600, in accordance with an embodiment of the present invention. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be understood that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a spin transfer torque element as described in the present description. In an embodiment, the memory device 608 is embedded in the microprocessor 602, as depicted in FIG. 6.

Figure 7:
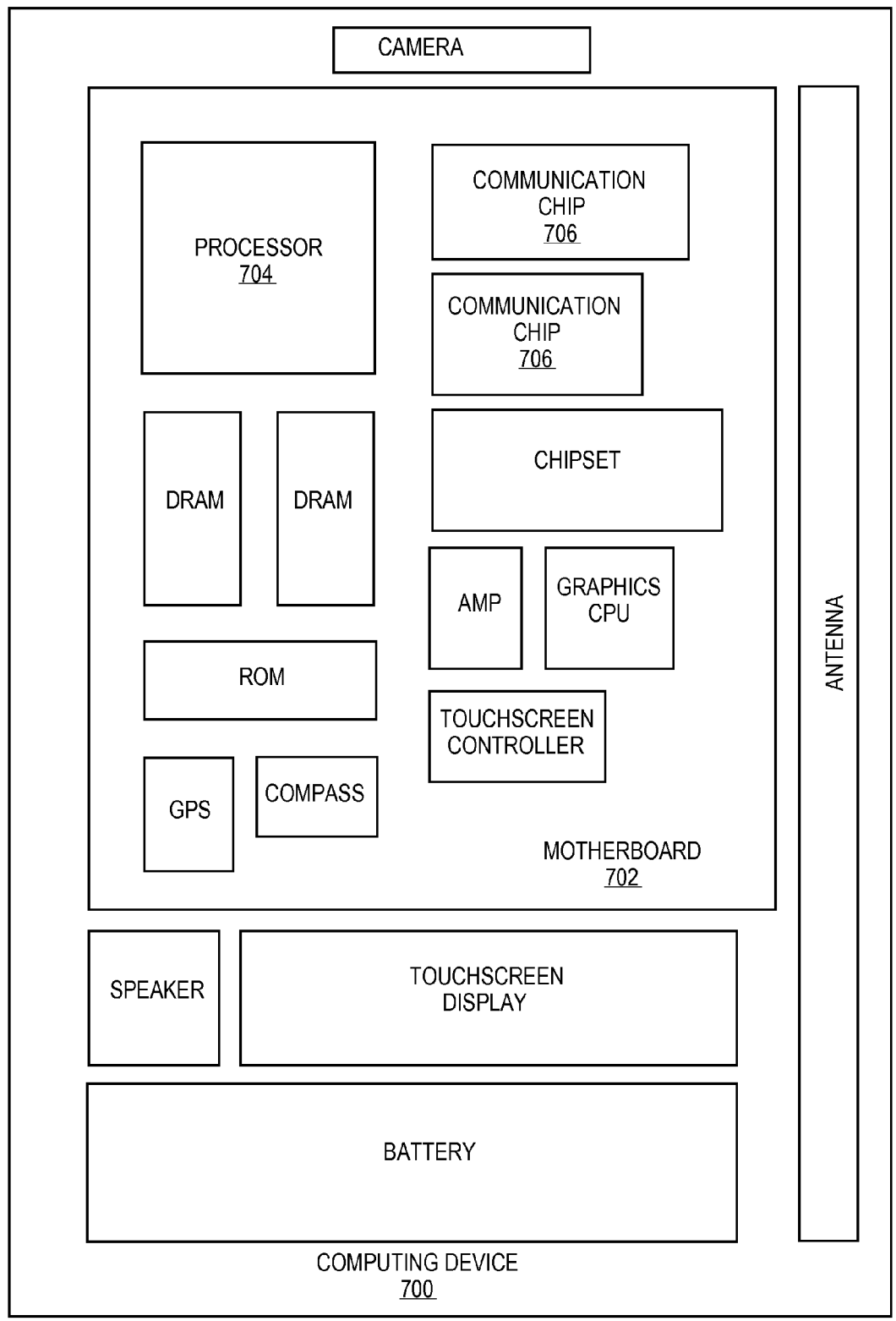
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as spin transfer torque memory built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as spin transfer torque memory built in accordance with implementations of the invention.

In further implementations, another component housed within the computing device 700 may contain an integrated circuit die that includes one or more devices, such as spin transfer torque memory built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Accordingly, one or more embodiments of the present invention relate generally to the fabrication of microelectronic memory. The microelectronic memory may be non-volatile, wherein the memory can retain stored information even when not powered. One or more, embodiments of the present invention relate to the fabrication of a perpendicular spin transfer torque memory element for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

Thus, embodiments of the present invention include perpendicular spin transfer torque memory (STTM) devices with enhanced stability and methods of fabricating perpendicular STTM devices with enhanced stability.

In an embodiment, a material layer stack for a magnetic tunneling junction includes a fixed magnetic layer. A dielectric layer is disposed above the fixed magnetic layer. A free magnetic layer is disposed above the dielectric layer. A conductive oxide material layer is disposed on the free magnetic layer.

In one embodiment, the free magnetic layer includes iron/cobalt (Fe/Co) atoms, and at least a portion of the Fe/Co atoms at an interface between the conductive oxide material layer and the free magnetic layer are oxidized.

In one embodiment, the free magnetic layer is composed of CoFeB, and the interface between the conductive oxide material layer and the free magnetic layer provides a perpendicular magnetic component for the magnetic tunneling junction.

In one embodiment, the dielectric layer is composed of magnesium oxide (MgO), the free magnetic layer is disposed on the dielectric layer, at least a portion of the Fe/Co atoms at an interface between the dielectric layer and the free magnetic layer are oxidized, and the interface between the dielectric layer and the free magnetic layer provides a second perpendicular magnetic component for the magnetic tunneling junction.

In one embodiment, the material layer stack further includes one or more pairs of alternating magnetic and non-magnetic layers disposed on the conductive oxide material layer.

In one embodiment, the alternating magnetic and non-magnetic layers are composed of cobalt (Co) and palladium (Pd), respectively, with a Co layer disposed on the conductive oxide material layer, and an interface between the conductive oxide material layer and the Co layer provides a third perpendicular magnetic component for the magnetic tunneling junction.

In one embodiment, the material layer stack further includes one or more pairs of alternating magnetic and non-magnetic layers disposed on the conductive oxide material layer, with a magnetic layer disposed on the conductive oxide material layer, and an interface between the conductive oxide material layer and the magnetic layer provides a perpendicular magnetic component for the magnetic tunneling junction.

In one embodiment, the conductive oxide material layer is composed of a material such as, but not limited to, an oxide of tantalum, $In_2O_{3-x}$, $VO_2$, $V_2O_3$, $WO_2$, Sn-doped $In_2O_3$ (ITO), and doped ZnO, with In or Ga, for example, or RuO.

In one embodiment, the conductive oxide material layer is approximately 10-1000 times more conductive than the dielectric layer.

In one embodiment, the magnetic tunneling junction is a perpendicular magnetic tunneling junction.

In an embodiment, a non-volatile memory device includes a bottom electrode. A fixed magnetic layer is disposed above the bottom electrode. A dielectric layer is disposed above the fixed magnetic layer. A free magnetic layer is disposed above the dielectric layer. A conductive oxide material layer is disposed on the free magnetic layer. A top electrode is disposed above the conductive oxide material layer. A transistor is electrically connected to the top or the bottom electrode, a source line, and a word line.

In one embodiment, the free magnetic layer comprises iron/cobalt (Fe/Co) atoms, and at least a portion of the Fe/Co atoms at an interface between the conductive oxide material layer and the free magnetic layer are oxidized.

In one embodiment, the free magnetic layer is composed of CoFeB, and the interface between the conductive oxide material layer and the free magnetic layer provides a perpendicular magnetic component for the non-volatile memory device.

In one embodiment, the dielectric layer is composed of magnesium oxide (MgO), the free magnetic layer is disposed on the dielectric layer, at least a portion of the Fe atoms at an interface between the dielectric layer and the free magnetic layer are oxidized, and the interface between the dielectric layer and the free magnetic layer provides a second perpendicular magnetic component for the non-volatile memory device.

In one embodiment, the non-volatile memory device further includes one or more pairs of alternating magnetic and non-magnetic layers disposed on the conductive oxide material layer, below the top electrode.

In one embodiment, the alternating magnetic and non-magnetic layers are composed of cobalt (Co) and palladium (Pd), respectively, with a Co layer disposed on the conductive oxide material layer, and an interface between the conductive oxide material layer and the Co layer provides a third perpendicular magnetic component for the non-volatile memory device.

In one embodiment, the non-volatile memory device further includes one or more pairs of alternating magnetic and non-magnetic layers disposed on the conductive oxide material layer, below the top electrode, with a magnetic layer disposed on the conductive oxide material layer, and an interface between the conductive oxide material layer and the magnetic layer provides a perpendicular magnetic component for the non-volatile memory device.

In one embodiment, the conductive oxide material layer is composed of a material such as, but not limited to, an oxide of tantalum, $In_2O_{3-x}$, $VO_2$, $V_2O_3$, $WO_2$, Sn-doped $In_2O_3$ (ITO), and doped ZnO, with In or Ga, for example, or RuO.

In one embodiment, the conductive oxide material layer is approximately 10-1000 times more conductive than the dielectric layer.

In one embodiment, the non-volatile memory device is a perpendicular spin torque transfer memory (STTM) device.

In one embodiment, the non-volatile memory device further includes an anti-ferromagnetic layer disposed between the bottom electrode and the fixed magnetic layer.

In an embodiment, a method of fabricating a material layer stack for a magnetic tunneling junction includes forming a free magnetic layer on a dielectric layer, and forming a conductive oxide material layer on the free magnetic layer.

In one embodiment, forming the conductive oxide material layer includes depositing a metal film and then consuming the metal film with oxygen.

In one embodiment, forming the conductive oxide material layer includes depositing a metal film in the presence of oxygen to consume the metal in situ.

In one embodiment, forming the conductive oxide material layer includes depositing a conductive oxide film stoichiometrically.

In one embodiment, forming the conductive oxide material layer includes forming a layer of material such as, but not limited to, an oxide of tantalum, $In_2O_{3-x}$, $VO_2$, $V_2O_3$, $WO_2$, Sn-doped $In_2O_3$ (ITO), and doped ZnO, with In or Ga, for example, or RuO.

In one embodiment, forming the conductive oxide material layer includes oxidizing a portion of the free magnetic layer.

What is claimed is:

1. A method of fabricating a material layer stack for a magnetic tunneling junction, the method comprising:
   forming a free magnetic layer on a dielectric layer; and
   forming a conductive oxide material layer on the free magnetic layer to form an interface between the conductive oxide material layer and the free magnetic layer, wherein forming the conductive oxide material layer comprises forming a layer of material selected from the group consisting of an oxide of tantalum, $In_2O_{3-x}$, $VO_2$, $V_2O_3$, $WO_2$, Sn-doped $In_2O_3$ (ITO), In- or Ga-doped ZnO, and RuO, and wherein the interface between the conductive oxide material layer and the free magnetic layer provides a perpendicular magnetic component for the magnetic tunneling junction.

2. The method of claim 1, wherein forming the conductive oxide material layer comprises depositing a metal film and then consuming the metal film with oxygen.

3. The method of claim 1, wherein forming the conductive oxide material layer comprises depositing a metal film in the presence of oxygen to consume the metal in situ.

4. The method of claim 1, wherein forming the conductive oxide material layer comprises depositing a conductive oxide film stoichiometrically.

5. The method of claim 1, wherein forming the conductive oxide material layer comprises oxidizing a portion of the free magnetic layer.

* * * * *